United States Patent [19]

SpringThorpe

[11] 4,342,944
[45] Aug. 3, 1982

[54] LIGHT EMITTING DIODES WITH HIGH EXTERNAL QUANTUM EFFICIENCY

[75] Inventor: Anthony J. SpringThorpe, Richmond, Canada

[73] Assignee: Northern Telecom Limited, Montreal, Canada

[21] Appl. No.: 186,967

[22] Filed: Sep. 15, 1980

[51] Int. Cl.³ .............................................. H01J 1/70
[52] U.S. Cl. .................................... 313/499; 313/113
[58] Field of Search ................................ 313/499, 113

[56] References Cited

U.S. PATENT DOCUMENTS 3,416,047 12/1968 Beale et al. ..................... 313/499 X
3,493,811 2/1970 Ewing ............................. 313/499 X
3,576,586 8/1971 Ross ................................. 313/499 X
4,279,690 7/1981 Dierschke ........................... 313/499

Primary Examiner—Robert Segal
Attorney, Agent, or Firm—Stuart L. Wilkinson

[57] ABSTRACT

A surface emitting light emitting diode (LED) has a reflecting element to redirect light emitted away from the light emitting region towards an exit window. The LED bottom contact is formed over the reflecting element and a current confining path is set up within the LED to funnel current between the top and bottom contacts around the reflecting element and through the light emitting region.

17 Claims, 3 Drawing Figures

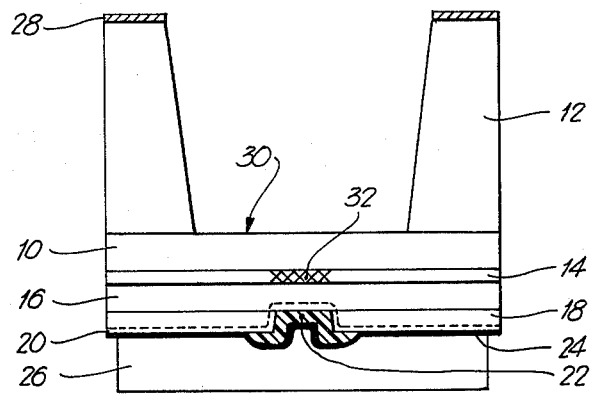
*Fig-1-*
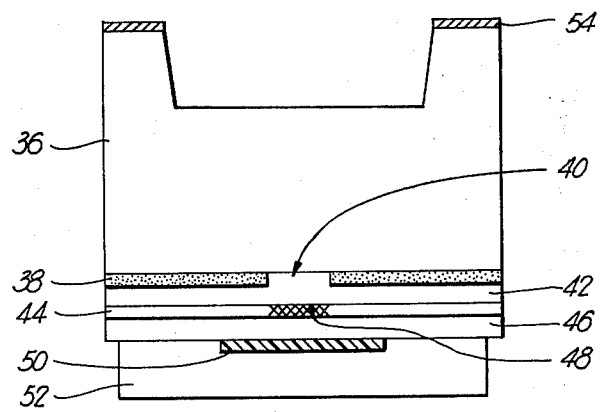
*Fig-2-*
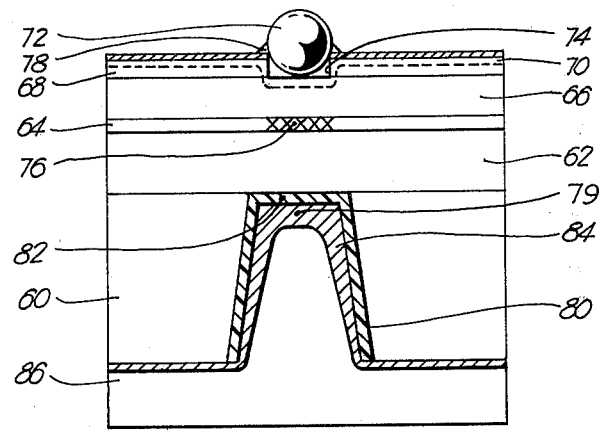
*Fig-3-*

LIGHT EMITTING DIODES WITH HIGH EXTERNAL QUANTUM EFFICIENCY

This invention relates to surface emitting light emitting diodes (LED) with enhanced external quantum efficiency.

Although the internal quantum efficiency of surface emitting LED's is of the order of 80-100 percent, only 2-2.5 percent (top emitters) or 4-5 percent (Burrus-type LED's) of the internally generated light can escape from the LED. The high refractive index of LED semiconductor material, for example GaAlAs, causes total internal reflection for all rays that strike the surface at an angle greater than the critical angle $\theta c$. If the light emitting region of the device is considered as a point source emitting into a spherical volume, then only ½ of the light is emitted into the positive hemisphere. Of this light, only a fraction $Sin^2\theta_c$ will strike a given LED surface at less than the critical angle. Furthermore, only $(1-r)$, where r is the reflectivity of the GaAlAs/air interface, will emerge from the surface. If the LED has a reflecting back contact however, (reflectivity R) then, by multiple reflection processes, the factor $(1-r)$ must be multiplied by $(1+R/1-rR)$. In these calculations, the influence of internal absorption is neglected. Thus, the external quantum efficiency ($\eta_{ext}$) can be related to the internal efficiency ($\eta_{int}$) as follows:

$$\eta_{ext} = \begin{pmatrix} \text{Fraction of} \\ \text{light going to} \\ \text{upper face} \end{pmatrix} \begin{pmatrix} \text{Fraction of light} \\ \text{not totally} \\ \text{internally reflected} \end{pmatrix} \begin{pmatrix} \text{Effective} \\ \text{Reflection} \\ \text{Loss} \end{pmatrix}$$

or $$\eta_{ext} = \eta_{int}/2 \, Sin^2\theta_c \frac{(1-r)(1+R)}{1-rR}$$

Inserting values of $r=0.3$, $\eta_{ext}=4\%$ and $\eta_{int}=80\%$ then the equation yields a value of $R=0.55$ for the back contact reflectivity. By increasing R to 1.0, $\eta_{ext}$ increases by 50% to about 6.1%. In order to increase the back contact reflectivity, a surface emitting emitting light emitting diodes structure is proposed comprising:

a semiconductor substrate on which is grown a double heterostructure consisting of a first confining layer, an active layer and a second confining layer, a transparent element on one side of the heterostructure permitting exit of light emitted from an emitting region of the active layer, a reflective element on the other side of the heterostructure for reflecting emitted light towards the transparent element, the transparent element, the emitting region and the reflective element being substantially aligned, first contact metallization extending around the transparent element, second contact metallization extending around the reflective element, and current directing means causing current entering at one contact metallization to converge towards the emitting region and to diverge from the emitting region to the other contact metallization.

The reflecting layer can, for example, be a layer of silicon dioxide in the thickness range of 1000 Å to 2000 Å units coated with a reflective metal, for example, Cr/Au or Ti/Pt. The reflective metal is preferably a central part of the second contact metallization, the composition of the contact metallization depending on the carrier type of the underlying semiconductor layer. The reflective layer may alternatively comprise a multi-layer dielectric, for example, a stack of quarter-wavelength ($\lambda/4$) layers of $Al_2O_3$ and Si.

The current directing means depends on the particular LED design and on the heterostructure system.

For example, particularly adapted for the GaAlAs system, the structure can include an n-type barrier layer formed on the second confining layer except as a central region thereof in vertical alignment with the emitting region. The structure can also incorporate a p-type diffusion layer extending both into the barrier layer and into the second confining layer at said central region. The junction of the barrier layer and the second confining layer forms, in operation, a reverse-biased isolating pn junction, current thus being funneled along the p-type diffusion layer and into the second confining layer where the p-type diffusion layer extends into the second confining layer.

Although a similar structure can be fabricated using an InP heterostructure, an alternative structure particularly adapted for the InP system has a current confining path defined on one side by a highly conductive second confining layer and on the other side by a reverse-biased annular p-n junction whereby current is directed to a central region of the device.

Three embodiments of the invention will now be described by way of example with reference to the accompanying drawings in which:

FIGS. 1 to 3 are sectional views of surface emitting light emitting diodes (LED), each LED using a reflective element to attain increased external quantum efficiency.

Referring in detail to FIG. 1, there is shown a surface emitting LED consisting of a GaAlAs heterostructure. To fabricate the structure, a first confining layer of n-type $Ga_{0.78}Al_{0.22}As$ is grown by liquid phase epitaxy on a GaAs substrate 12. A 0.1-2 micron active layer 14 of p-type $Ga_{0.95}Al_{0.05}As$ is then grown on the first confining layer 10. A 1-3 micron second confining layer 16 of p-type $Ga_{0.95}Al_{0.05}As$ is then grown on the active layer 14. A 1 micron capping barrier layer 18 of n-type $Ga_{0.90}Al_{0.10}As$ is then grown on the second confining layer 16. The higher aluminum content of this layer compared to the active layer ensures low light absorption. Using standard photoengraving techniques, a circular window of about 50 microns diameter is opened up in the barrier layer 18 using selective etching procedures. For example, a solution of $H_2O_2$ and NaOH having a pH of about 8 attacks the layer 18 leaving the second confining layer 16 intact. Alternatively an anodic etching technique can be used to produce a window whose boundary is independent of crystallograhic planes. A zinc diffusion is then carried out over the whole lower surface of the chip to produce a 0.5-0.7 micron layer 20 of p-type material over the outer surface of the layer 18, including the boundary surface of the window, and extending into the exposed region of the confining layer 16. This is done by enclosing the chip for 20 minutes in an atmosphere generated by heating a composition of 1 g GaAs, 1 g Ga and 500 mg Zn to 600° C. in a 250 cc ampoule. A 1500Å layer of silicon dioxide is then chemically vapor deposited over the upper surface of the chip and is etched using buffered HF to leave a 75 micron diameter dot 22 in alignment with the circular window. A Cr/Au metallization contact 24 is then vacuum evaporated over the silicon dioxide dot and a 5-10 micron gold heat sink 26 is plated over the bottom surface of the chip. Lastly, a 200 Å Au/Ge; 2000 Å Au contact layer 28 is evaporated onto the top surface of the substrate, a well 30 then being etched into the substrate down to the first confining layer to permit emission of light.

In operation, a current in the range of 1-500 mA flows from a bottom contact 24/26 to the top contact 28 through an emitting region 32. The emitting region does not lie in a direct line between the top and bottom contacts since the top contact 28 is an angular contact extending around the well 30 and, similarly, the bottom contact 26/24 is an annular contact extending around the relatively high resistance silicon dioxide dot 22. Consequently, current, in passing between the contacts must be funnelled into and away from the emitting region 32. Current entering the bottom contact flows readily into the layers 20 and 18 but will not pass the reverse-biased junction between the barrier layer 18 and the second confining layer 16. The current consequently flows towards the centre of the chip to a region 32 where it encounters a zinc diffused conductive region extending into the confining layer 16. Current thus flows along the inside surface of the reflecting layer 22 until it can cross into the confining layer and, where it crosses, this defines the region 32 since the path to the active layer 14 from the zinc diffused layer 20 is relatively low resistance. There is, of course, some increase in series resistance of the device but more than compensating for this, the combination of the silicon dioxide layer 22 and the metallization 24 below the emitting region increases reflectivity significantly over the 0.55 value currently obtained by metallization alone.

Referring now to FIG. 2 there is a shown an enhanced external quantum efficiency top emitting LED structure which is particularly adapted for the InP heterostructure. InP devices are of growing interest since they emit longer wavelengths compatible with the minimum loss regime of optical fibres. The device illustrated in FIG. 2 differs from the GaAlAs device illustrated in FIG. 1 in that current confinement is solely achieved by the use of potential barriers within the LED chip instead of by external isolation and potential barriers.

To fabricate the InP-GaInAsP double heterostructure of FIG. 2, on a p-type InP substrate 36, a 1-3 micron layer 38 of n-type InP is grown by liquid phase epitaxy. A window 40 is opened in the n-type layer 38 using conventional photolithographic and etching techniques. The diameter of the window 40 corresponds to the desired emitting area of the LED and is in the range of 15-100 microns. The p-type substrate 36 is exposed at the window 40. Subsequently a double heterostructure layer sequence comprising a first confining layer 42 of 2-3 microns p-type InP, a 0.2-2 micron active layer 44 of p- or n-type GaInAsP and a 1.5-3 micron second confining layer 46 of n-type InP are grown. The internal layer 38 provides a reverse biased pn junction in operation and so restricts current flow to the window region 40. As a result, light emission is also restricted to a region 48 of the active layer 44 in vertical alignment with the window 40.

As in the previous embodiment, a 1500 Å layer of silicon dioxide 50 is deposited over the bottom surface of the second confining layer 46 using chemical vapor deposition. The silicon dioxide 50 is photo-engraved to yield dots somewhat larger than the emitting region 48 so as to redirect as much light as possible. The silicon dioxide dot is provided with a gold plated heat sink 52 which extends substantially over the whole of the bottom surface of the chip. The inner surface of the gold layer forms an annular contact region with the highly conductive n-type InP. In contrast with the FIG. 1 embodiment, the bottom contact 32 and a Au/Be 2000 Å annular top contact 54 do not determine current confinement to the emitting region, and so have relatively large contact areas on both crystal surfaces which provides a low series resistance. The current confinement is ensured by the highly conductive n-type second confining layer 46 which encourages current to move inwardly towards the emitting region 48 and window 40 rather than to cross the reverse-biased pn junction between the first confining layer 42 and the internal layer 38.

As in the previous embodiment, the reflective element 50 ensures an improvement in light output of the order of 3 dB. A similar structure could be obtained by reversing the carrier types of all the semiconductor materials. However, it is doubtful if significant carrier confinement will result due to the much higher conductivity of n-type InP, so the structure illustrated is preferred.

Although the combination of a silicon dioxide layer backed by reflecting metallization of, for example, Cr/Au provides an adequate reflective element, the silicon dioxide could be substituted by another suitable dielectric, for example, alumina. Alternatively, reflection can be accomplished by a multilayer dielectric of the type described by Ettenberg (Applied Physics Letters Vol. 32 (11) June 1, 1978, pp 724–725).

The surface emitting GaAs/GaAlAs double heterostructure LED illustrated in FIG. 3 is structurally in many respects the inverse of the LED as shown in FIG. 1. Thus the LED has a substrate 60 of GaAs, a 25 micron first confining layer 62 of n-type GaAlAs, a 0.1-5 micron active layer 64 of p-type GaAs, a 1-3 micron second confining layer 66 of p-type GaAlAs, a 1 micron barrier 68 of n-type GaAlAs, and a 0.5-0.7 micron zinc diffused p-type layer 70, the p-type layer 70 extending into the second confining layer 66 as described with respect to FIG. 1. Advantage is taken of the surface geometry of this embodiment to self-align a spherical lens 72 in a recess 74 etched through to the second confining layer 66. A 70 Å Cr-200Å Au contact layer is deposited on the diffuse layer 70 around the recess 74. The three top layers act to funnel contact to an emitting region 76 as has been described with respect to FIG. 1. The lens 72 which adheres within the recess 74 by means of a transparent epoxy 78, serves to collect the emitted light and enhances the coupling into an output fibre (not shown). As previously described, the layers 62, 64, 66 and 68 are grown by, for example, liquid phase epitaxy and the recess 74 is opened up using conventional photo-engraving techniques including a selective etchant. Further details of the LPE processing may be found in U.S. patent Ser. No. 4,086,126.

The substrate is processed by first evaporating a Au/Ge layer 79 onto the substrate surface and then etching a well 80 through to the first confining layer using a selective etchant. Subsequently, a 1000-2000 Å reflecting layer 82 of silicon dioxide is chemically vapor deposited into the well after first masking the bottom metallization 79. The silica layer 82 is followed by an evaporated layer of Cr/Au 84 to provide thermal contact between the silicon dioxide layer and a subsequently electroplated layer 86 of Au.

In operation, light which would normally be lost in the substrate due to absorption and total internal reflection is reflected at the reflecting layer 82 upwardly towards the lens 72. Although some license may be taken with the thicknesses of the various layers of the device, the first confining layer 62 should be 25 microns or greater to ensure a low series resistance for current which is forced to flow outwardly from the emitting region 76 and around the well 82 to reach the bottom metallization 82.

Although in the description of the three embodiments, crystal grown has been described in terms of liquid phase epitaxy, in fact a variety of methods may be used to obtain the heterostructures; for example, organo metallic pyrolysis, molecular beam epitaxy, and chemical vapour deposition. Also some licence can be taken with the thickness of the various heterostructure layers and the identity of elements used in the heterostructures as is known in the LED fabrication art. In addition, although silicon dioxide/metal reflective layers are preferred for ease of fabrication, other combinations, for example alumina/metal can be used with alternate etchants, for example, phosphoric acid etchants. Similarly $\frac{1}{4}$ wavelength layers of differing refractive index materials will also give the desired reflectivity.

The essence of the invention is that a light emitting region should be directly between a transmissive element and a reflective element and that the contact metallization at respective sides should be radially outward of these elements. The LED should include means for causing currents to converge from the input metallization to the emitting region and to cause the current to diverge from the emitting region to the output metallization. That means can, for example, be a reverse-biased pn junction, a region of enhanced conductivity, or can be merely defined by the geometry of the device.

What is claimed is:

1. A surface emitting light emitting diode comprising: a semiconductor substrate on which is grown a double heterostructure consisting of a first confining layer, an active layer, and a second confining layer; a transparent element on one side of the heterostructure permitting exit of light emitted from an emitting region of the active layer; a reflective element on the other side of the heterostructure for reflecting emitted light towards the transparent element, the transparent element, the emitting region, and the reflective element being substantially aligned; first contact metallization extending around the transparent element; a second contact metallization extending around the reflective element; and current directing means causing current entering at one contact metallization to converge towards the emitting region and to diverge from the emitting region to the other contact metallization.

2. A light emitting diode as claimed in claim 1 in which the transparent element comprises a window in said first contact metallization.

3. A light emitting diode as claimed in claim 2 in which the transparent element further comprises a well extending into the semiconductor.

4. A light emitting diode as claimed in claim 1 in which the reflective element comprises a layer of dielectric and a metal layer on a surface of the dielectric layer remote from the emitting region.

5. A light emitting diode as claimed in claim 4 in which the dielectric is silicon dioxide.

6. A light emitting diode as claimed in claim 4 in which the second contact metallization forms a lateral extension of the metal layer.

7. A light emitting diode as claimed in claim 1 in which the reflecting element is a multi-layer dielectric.

8. A light emitting diode as claimed in claim 7 in which the multi-layer dielectric includes alternating layers of alumina and silicon.

9. A light emitting diode as claimed in claim 1 in which a well extends into the substrate, the well being vertically aligned with the emitting region, the reflecting element comprising a reflective layer on a bottom surface of the well.

10. A light emitting diode as claimed in claim 9 in which the second contact metallization is formed on an outer surface of the substrate and extends around the well.

11. A light emitting diode as claimed in claim 9, the heterostructure being a GaAlAs heterostructure, the first confining layer being at least 25 microns in thickness.

12. A light emitting diode as claimed in claim 9 in which a metal heat sink extends into the well and contacts the reflecting layer.

13. A light emitting diode as claimed in claim 1 in which the current directing means is formed by an n-type barrier layer formed on the second confining layer except at a central region thereof in vertical alignment with the emitting region, a p-type diffusion layer extending into the barrier layer and into the second confining layer at said central region, the junction of the barrier and the second confining layer forming, in operation, a reverse-biased isolating p-n junction, current thus being funneled along said p-type diffusion layer and into the second confining layer where the p-type diffusion layer extends into the second confining layer.

14. A light emitting diode as claimed in claim 13 formed as a GaAlAs heterostructure.

15. A light emitting diode as claimed in claim 1 in which the current directing means is formed by an annular region within the first confining layer, said annular region and the first confining layer being oppositely doped whereby, in operation, to establish a reverse-biased junction at said annular region, which junction confines current to a central window.

16. A light emitting diode as claimed in claim 15 in which the first confining layer is p-type InP and the annular region is n-type InP.

17. A light emitting diode as claimed in claim 15 in which the second confining layer is highly conductive n-type InP.

* * * * *